United States Patent
Barth, Jr. et al.

(10) Patent No.: US 7,989,893 B2
(45) Date of Patent: Aug. 2, 2011

(54) SOI BODY CONTACT USING E-DRAM TECHNOLOGY

(75) Inventors: John E. Barth, Jr., Williston, VT (US); Kerry Bernstein, Underhill, VT (US); Francis R. White, Essex Junction, VT (US)

(73) Assignee: International Business Machines Corporation, Armonk, NY (US)

( * ) Notice: Subject to any disclaimer, the term of this patent is extended or adjusted under 35 U.S.C. 154(b) by 323 days.

(21) Appl. No.: 12/200,482

(22) Filed: Aug. 28, 2008

(65) Prior Publication Data

US 2010/0052053 A1 Mar. 4, 2010

(51) Int. Cl.
*H01L 27/01* (2006.01)
*H01L 29/786* (2006.01)

(52) U.S. Cl. .............................. 257/351; 257/E29.273

(58) Field of Classification Search .................. 257/351, 257/E29.273
See application file for complete search history.

(56) References Cited

U.S. PATENT DOCUMENTS

| | | | |
|---|---|---|---|
| 6,096,608 A | 8/2000 | Williams | |
| 6,143,607 A | 11/2000 | Chi | |
| 6,320,225 B1 * | 11/2001 | Hargrove et al. | 257/347 |
| 6,437,405 B2 * | 8/2002 | Kim | 257/347 |
| 6,514,809 B1 * | 2/2003 | Xiang | 438/214 |
| 6,593,612 B2 | 7/2003 | Gruening et al. | |
| 6,657,258 B2 | 12/2003 | Bae | |
| 6,670,675 B2 * | 12/2003 | Ho et al. | 257/347 |
| 6,794,716 B2 | 9/2004 | Park et al. | |
| 6,930,357 B2 * | 8/2005 | Kang | 257/347 |
| 6,958,516 B2 * | 10/2005 | Wong | 257/349 |
| 6,965,148 B2 * | 11/2005 | Hirose et al. | 257/349 |
| 7,015,549 B2 * | 3/2006 | Kim et al. | 257/347 |
| 7,038,276 B2 | 5/2006 | Ker et al. | |
| 7,211,474 B2 | 5/2007 | Cheng et al. | |
| 2002/0132395 A1 * | 9/2002 | Iyer et al. | 438/149 |
| 2007/0045698 A1 | 3/2007 | Cheng et al. | |
| 2007/0241365 A1 * | 10/2007 | Iwamatsu | 257/147 |
| 2008/0113474 A1 * | 5/2008 | Lee et al. | 438/151 |

\* cited by examiner

*Primary Examiner* — Lex Malsawma
(74) *Attorney, Agent, or Firm* — Cantor Colburn LLP; Vazken Alexanian (57) ABSTRACT

A semiconductor structure is disclosed. The semiconductor structure includes an active semiconductor layer, a semiconductor device having a gate disposed on top of the active semiconductor layer, and source and drain regions and a body/channel region disposed within the active semiconductor layer, an insulator layer having a first and second side, the first side being adjacent to the active semiconductor layer, a substrate disposed adjacent to the second side of the insulator layer, a body contact disposed under the body/channel region and in the insulator layer. The body contact electrically connects with and contacts with the body/channel region of the semiconductor device and the substrate, to thereby form an ohmic contact and to eliminate floating body effects.

7 Claims, 7 Drawing Sheets

SOI BODY CONTACT USING E-DRAM TECHNOLOGY

BACKGROUND

The present invention relates to complimentary metal oxide semiconductor (CMOS) structures, and more specifically, to a semiconductor structure having an improved silicon-on-insulator (SOI) body contact capable of preventing a floating body effect.

In a typical SOI device, the body of the device is electrically isolated between source and drain regions of the device. Floating body effects occur based on the accumulation of charge carriers in the body of the device. Floating body effects also cause fluctuations in threshold voltage of the device. This problem is apparent for devices such as those used in dynamic random access memory (DRAM) where it is critical that the threshold voltage remain fixed such that the device remains in an off position to prevent charge leakage from the storage capacitor. Body contacts are intended to prevent floating body effects in the device. These contacts are needed when precise device behavior is required. Thus, the body contact is used to electrically connect the body of the device to a fixed potential to prevent floating body effects.

Conventional body contacts may require additional area within the device or problems may occur when connecting the body to the fixed potential such as high impedance or grounding issues.

SUMMARY

According to one embodiment of the present invention, a semiconductor structure is disclosed. The semiconductor structure includes an active semiconductor layer, a semiconductor device having a gate disposed on top of the active semiconductor layer, and source and drain regions and a body/channel region disposed within the active semiconductor layer, an insulator layer having a first and second side, the first side being adjacent to the active semiconductor layer, a substrate disposed adjacent to the second side of the insulator layer, a body contact disposed under the body/channel region and in the insulator layer. The body contact electrically connects with and contacts with the body/channel region of the semiconductor device and the substrate.

In another embodiment, a semiconductor structure includes an active semiconductor layer, an insulator layer having a first and second side, the first side being adjacent to the active semiconductor layer, a substrate disposed adjacent to the second side of the insulator layer, a plurality of semiconductor devices, each semiconductor device includes a gate disposed on top of the active semiconductor layer, and source and drain regions and a body/channel region disposed within the active semiconductor layer, and a body contact disposed under the body/channel regions and in the insulator layer, and electrically connecting with and contacting with the body/channel regions of the semiconductor devices, and the substrate.

In yet another embodiment, a semiconductor structure includes an active semiconductor layer, an insulator layer having a first and second side, the first side being adjacent to the active semiconductor layer, a substrate disposed adjacent to the second side of the insulator layer, a plurality of semiconductor devices, each semiconductor device comprising source and drain regions and a body/channel region disposed within the active semiconductor layer, and sharing a common gate disposed on top of the active semiconductor layer, and a body contact disposed under the body/channel regions and in the insulator layer, and electrically connecting with and contacting with the body/channel regions of the semiconductor devices, and the substrate.

In yet another embodiment, a method of forming semiconductor structure. The method includes forming an insulator layer on top of a substrate, forming an active semiconductor layer on top of the insulator layer, forming a semiconductor device having a gate on top of the active semiconductor layer, and source and drain regions and a body/channel region within the active semiconductor layer, and forming a body contact under the body/channel region and in the insulator layer, and electrically connecting with and contacting with the body/channel region of the semiconductor device, and the substrate.

Additional features and advantages are realized through the techniques of the present invention. Other embodiments and aspects of the invention are described in detail herein and are considered a part of the claimed invention. For a better understanding of the invention with the advantages and the features, refer to the description and to the drawings.

BRIEF DESCRIPTION OF THE SEVERAL VIEWS OF THE DRAWINGS

The subject matter which is regarded as the invention is particularly pointed out and distinctly claimed in the claims at the conclusion of the specification. The forgoing and other features, and advantages of the invention are apparent from the following detailed description taken in conjunction with the accompanying drawings in which:

DETAILED DESCRIPTION

Figure 1A:
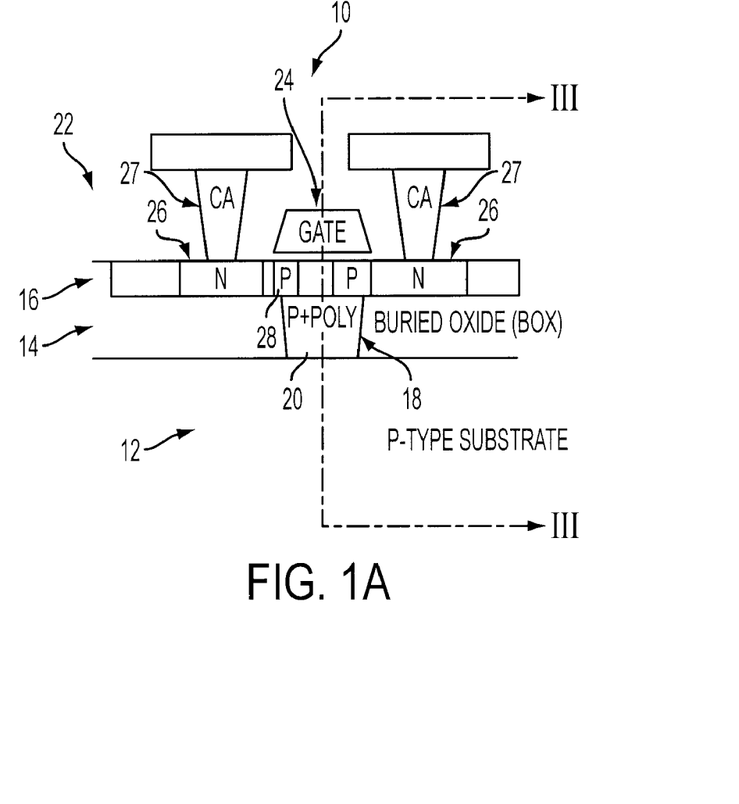
FIGS. 1A and 1B are a cross-sectional view and a lateral view illustrating a semiconductor structure that can be implemented within embodiments of the present invention.
Figure 1B:
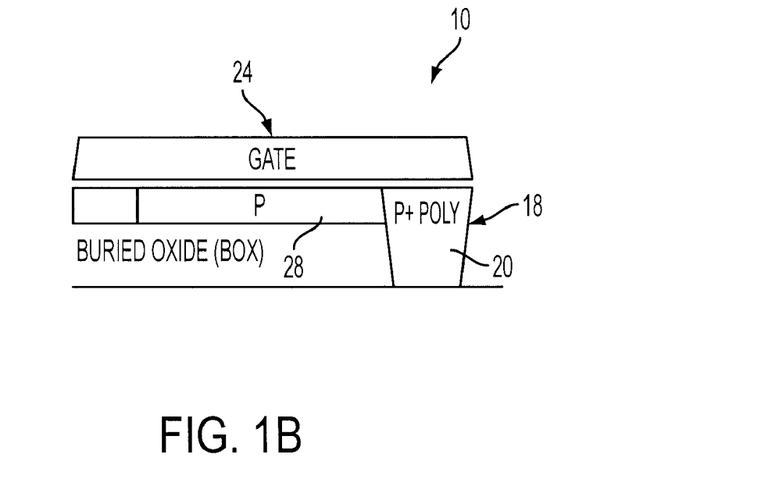

With reference now to FIGS. 1A and 1B, the present invention incorporates eDRAM technology into high performance semiconductor structures. As shown in FIGS. 1A and 1B, according to an embodiment, a multi-layer semiconductor structure 10 e.g., a silicon-on-insulator (SOI) structure incorporating a body contact 18 is provided in order to prevent floating body effects of a body of a semiconductor device within the semiconductor structure 10.

As shown in FIGS. 1A and 1B, the multi-layer semiconductor structure 10 includes a silicon-based substrate 12 such as a p-type substrate which acts as a handle wafer. An insulator layer 14 (e.g., a thick buried oxide (BOX) layer) is formed on top of the p-type substrate 12 having a thickness of approximately 1000 Angstroms (Å), via a low pressure chemical vapor deposition (LPCVD) process, for example. An active semiconductor layer 16 including n-type or p-type dopants is then formed on top of the insulator layer 14. A semiconductor device 22 is formed within and on top of the active semiconductor layer 16. The semiconductor device 22 includes a gate 24, source and drain regions 26 and a body/channel region 28 intermediate to the source and drain regions 26 and directly below the gate 24.

Figure 3:
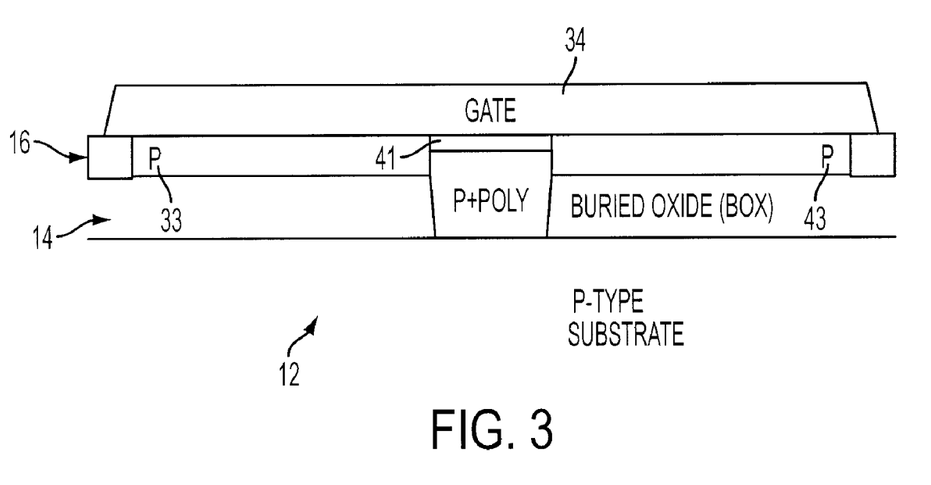
FIG. 3 is a cross-sectional view illustrating a semiconductor structure having a shared configuration between two semiconductor devices within the semiconductor structure that can be implemented within alternative embodiments of the present invention.

The body contact 18 is formed by etching and drilling a trench through the active semiconductor layer 16 and the insulator layer 14 to the bottom of the insulator layer 14. Conductive material 20 is then deposited into the trench via a deposition process. The conductive material 20 may be polysilicon or any suitable conductive material for the purposes disclosed herein may be used. In one embodiment, the conductive material 20 is doped polysilicon deposited via a low temperature epitaxial process. The conductive material 20 is then recessed in the trench such that a top surface of the trench borders the active semiconductor layer 16. A dielectric collar material (not shown) is then deposited and a dielectric collar is formed by directional etching of the dielectric collar material leaving a dielectric spacer on the sidewall of the trench. A mask (not shown) is then used to remove the dielectric collar material where contact between the body contact 18 and the body/channel region 28 is desired. The mask opening is smaller than the length of the gate 24 to prevent the trench material from shorting the channel to the source/drain regions 26. Additional conductive material 20 is deposited and planarized. Optionally, according to another embodiment, the conductive material 20 may be recessed into the trench such that the conductive material 20 remains in contact with the body/channel region 28 providing a desired electrical contact between the trench and the body/channel region 28 of the semiconductor device 22, and a dielectric may be deposited and planarized in order to form an isolation region 41 (as depicted in FIG. 3, for example) to electrically isolate the trench from all regions except the buried contact described above.

Further, as shown in FIGS. 1A and 1B, the semiconductor device 22 further includes contacts 27 which align the source and drain regions 26. The body contact 18 is electrically connected with and contacts the body/channel region 28, and the substrate 12, and is formed adjacent to the gate 24, and provides a low resistance connection from the body/channel region 28 to the substrate 12 (i.e., a fixed potential). According to one embodiment, the semiconductor device 22 is a NFET device that includes n+ source and drain regions 26 and a p+ body/channel region 28 beneath the gate 24. However, the present invention is not limited hereto, and any suitable device for the purpose described herein may be used. For example, a PFET device may be used, and will be described below with reference to FIGS. 7A and 7B.

According to one embodiment of the present invention, the body contact 18 is filled with the same type of silicon (p-type or n-type) as the body/channel region 28 of the device 22 to create an ohmic connection between the body/channel region 28 and the body contact 18. For example, as shown in FIGS. 1A and 1B, the body/channel region 28 and the body contact 18 are filled with p+polysilicon. Further, according to one embodiment, the body contact 18 is formed adjacent to an end portion of the body/channel region 28 beneath the gate 24.

Figure 2:
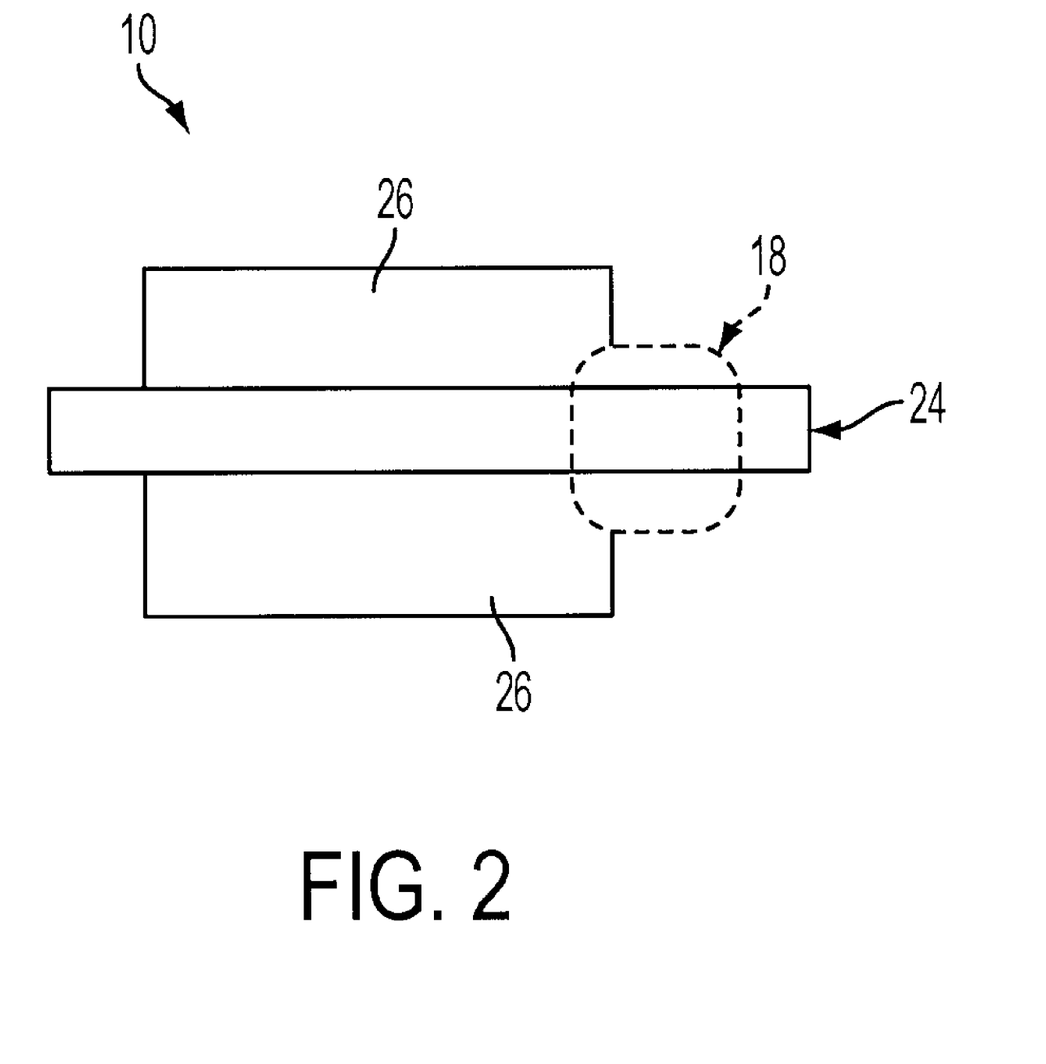
FIG. 2 is a top view illustrating the semiconductor structure as shown in FIGS. 1A and 1B.

FIG. 2 illustrates a top view of the semiconductor structure 10 as taken along the line III-III as shown in FIG. 1A. FIG. 2 illustrates the gate 24, source and drain regions 26 and the body contact 18. As shown in FIG. 2, a width of the body contact 18 is larger than a width of the gate 24 of the semiconductor device 22. Further, the body contact 18 is formed such that it is adjacent to an end portion of the gate 24 and contacts with the body/channel region 28 (as depicted in FIGS. 1A and 1B). The present invention is not limited to the body contact 18 being formed at a particular portion of the body/channel region 28, and may vary, as necessary. An alternative configuration will be described below with reference to FIGS. 5A, 5B and 6. Since the body contact 18 is formed at an end portion of the body/channel region 28 as shown in FIGS. 1A and 2, the body contact may be shared between multiple semiconductor devices as described below with reference to FIGS. 3 and 4, according to another embodiment of the present invention.

Figure 4:
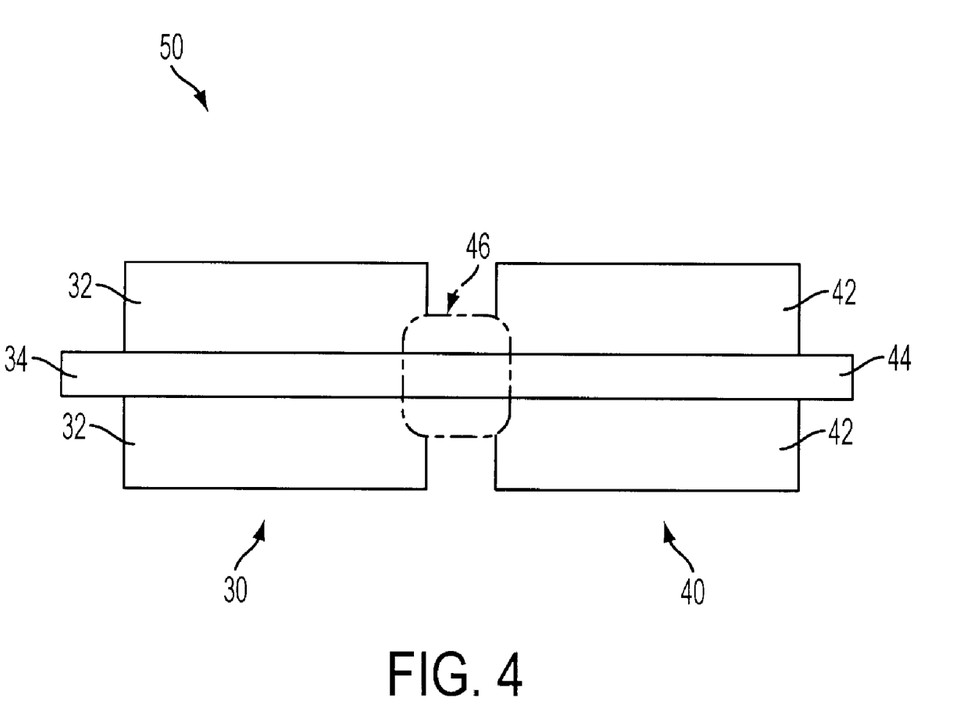
FIG. 4 is a top view illustrating the semiconductor structure as shown in FIG. 3.

FIGS. 3 and 4 respectively illustrate a cross sectional view and a top view of a semiconductor structure that can be implemented within an alternative embodiment of the present invention. As shown in FIGS. 3 and 4, a semiconductor structure 50 includes a plurality of semiconductor devices 30 and 40. The semiconductor device 30 includes the source and drain regions 32, a body/channel region 33 and the gate 34, and the semiconductor device 40 includes source and drain regions 42, a body/channel region 43 and gate 44. Alternatively, according to another embodiment, the semiconductor devices 30 and 40 share a common gate formed on top of the active semiconductor layer 16. In addition, the semiconductor structure 50 includes a body contact 46 shared between the semiconductor devices 30 and 40, and is electrically connected to the body/channel regions 33, 43 of both the semiconductor devices 30 and 40. According to one embodiment, a width of the body contact 46 is larger than a width of each gate 34 and 44 of the semiconductor devices 30 and 40. As shown in FIG. 3, the shared body contact 46 is formed beneath adjacent end portions of the body/channel regions 33, 43 of the plurality of semiconductor devices 30 and 40, and contacts with the body/channel regions 33, 43 and electrically connects the body/channel regions 33, 43 to each other, thereby providing a low resistance connection from the body/channel regions 33, 43 to the substrate 12.

As mentioned above, FIGS. 5A, 5B and 6 illustrate an alternative configuration of the body contact according to an embodiment of the present invention. Specifically, FIGS. 5A and 5B respectively illustrate a cross-sectional view and a lateral view of a semiconductor structure according to an embodiment of the present invention, and FIG. 6 illustrates a top view of the semiconductor structure as shown in FIGS. 5A and 5B, taken along the line IV-IV of FIG. 5A.

Figure 5A:
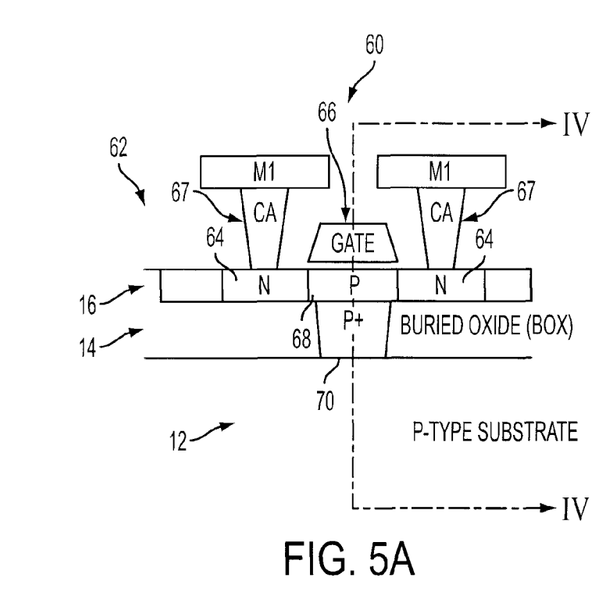
FIGS. 5A and 5B are a cross-sectional view and a lateral view illustrating a semiconductor structure that can be implemented within alternative embodiments of the present invention.
Figure 5B:
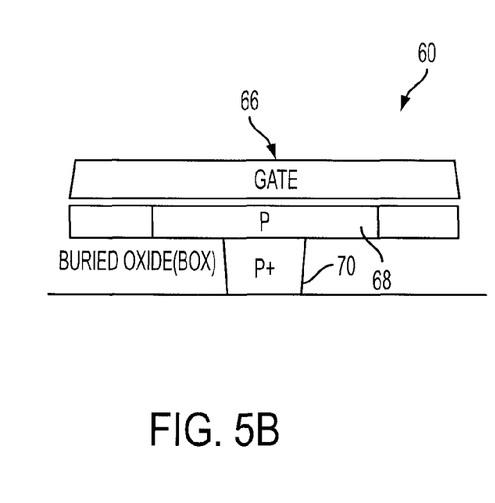
Figure 6:
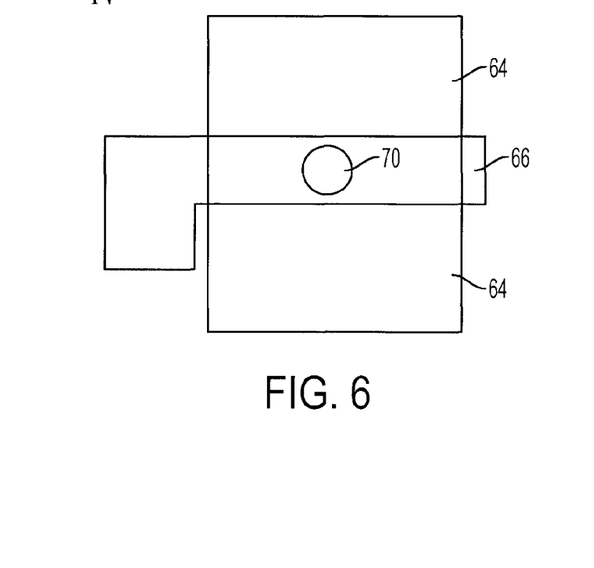
FIG. 6 is a top view of the semiconductor structure as shown in FIGS. 5A and 5B.

As shown in FIGS. 5A, 5B and 6, a semiconductor structure 60 according to an embodiment of the present invention, includes a NFET device 62 having n+ source and drain regions 64, a gate 66 and an p+ body/channel region 68 formed directly below the gate 66. A body contact 70 is formed below a center portion of the body/channel region 68 and electrically connects with and contacts the body/channel region 68. The body contact 70 is filled with p+ polysilicon i.e., the same material as that of the body/channel region 68, thereby creating a conductive path with the body/channel region 68.

Figure 7A:
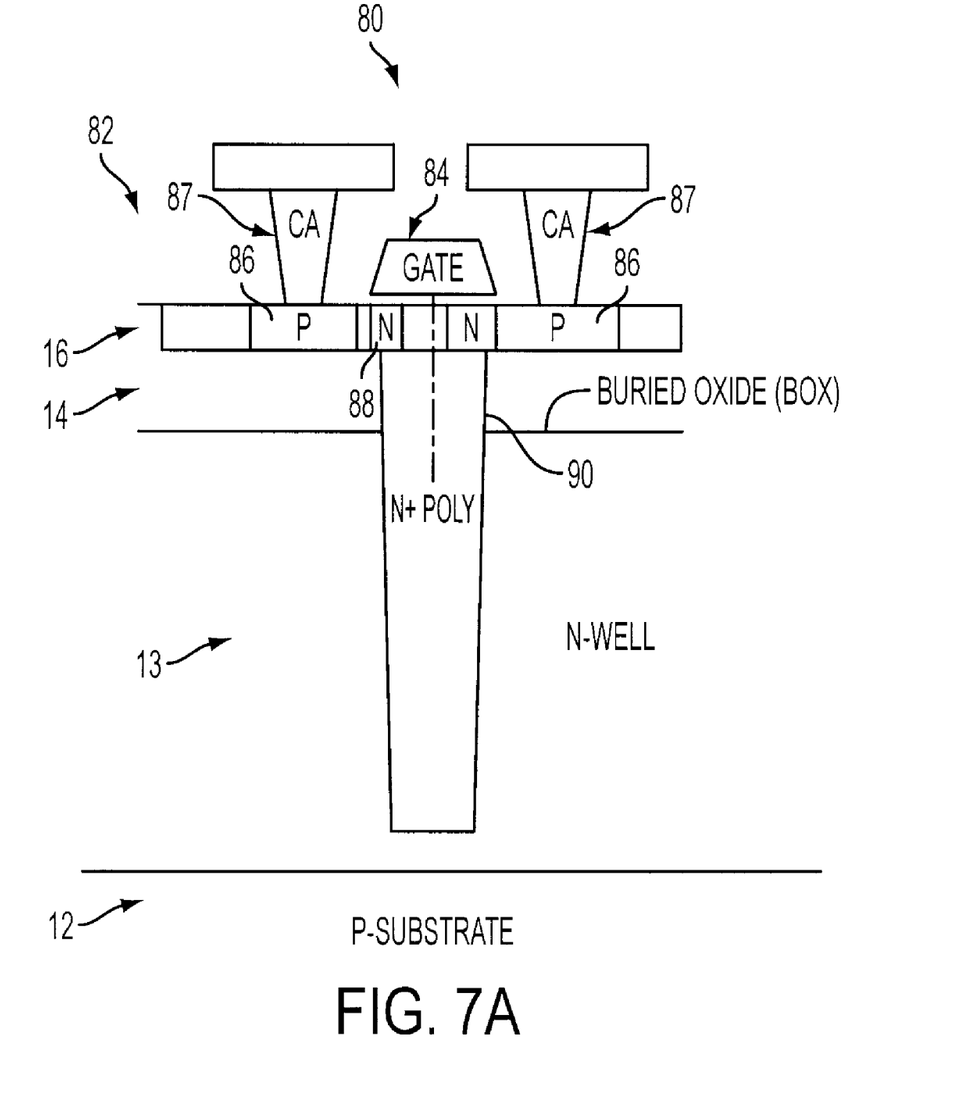
FIGS. 7A and 7B are a cross-sectional view and a lateral view illustrating a semiconductor structure that can be implemented within alternative embodiments of the present invention.
Figure 7B:
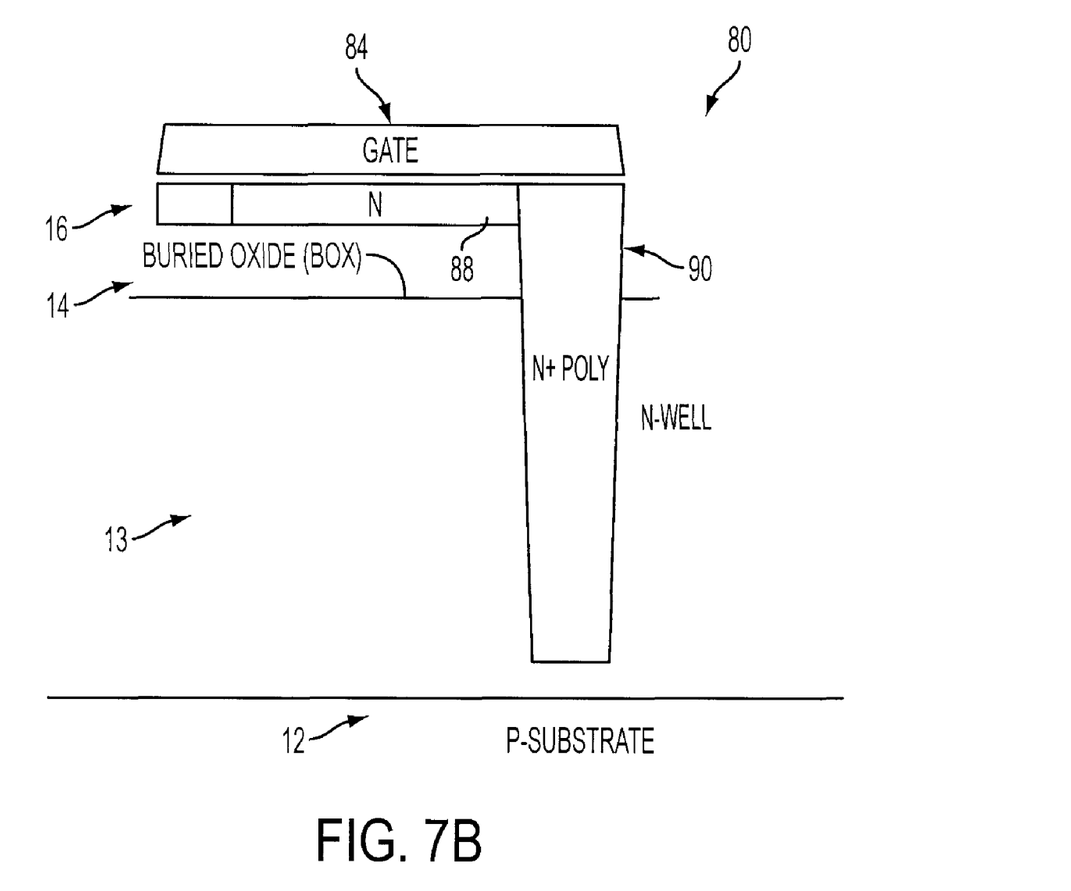

As mentioned above, FIGS. 7A and 7B illustrate a semiconductor structure according to an alternative embodiment of the present invention. The semiconductor structure 80 shown in FIG. 7 is similar to the semiconductor structure 10 shown in FIGS. 1A and 1B, except the semiconductor structure 80 shown in FIGS. 7A and 7B employs a PFET device 82 having a gate 84 formed on top of the active semiconductor layer 16, and p+ source and drain regions 86 and a n+ body/channel region 88 formed within the active semiconductor layer 16. Contacts 87 are aligned on the p+ source and drain regions 86. The semiconductor structure 80 further includes a body contact 90 filled with n+ polysilicon and extending through the buried oxide layer 14. In addition, since the semiconductor structure 80 includes a PFET device 82, an N-well 13 is formed between the buried oxide layer 14 and the p-substrate 12.

Since the present invention discloses a body contact formed under a body/channel region of an SOI device and electrically connecting with and contacting the body/channel region and the silicon-based substrate, the body/channel region is connected to a fixed potential and floating body effects are prevented.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one ore more other features, integers, steps, operations, element components, and/or groups thereof.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated While the preferred embodiment to the invention had been described, it will be understood that those skilled in the art, both now and in the future, may make various improvements and enhancements which fall within the scope of the claims which follow. These claims should be construed to maintain the proper protection for the invention first described.

What is claimed is:

1. A semiconductor structure comprising:
    an active semiconductor layer;
    an insulator layer having a first and second side, the first side being adjacent to the active semiconductor layer;
    a substrate disposed adjacent to the second side of the insulator layer;
    a plurality of semiconductor devices, each semiconductor device comprising a gate disposed on top of the active semiconductor layer, and source and drain regions and a body/channel region disposed within the active semiconductor layer; and
    a body contact disposed under the body/channel regions and in the insulator layer, and electrically connecting with and contacting with the body/channel regions of the semiconductor devices, and the substrate;
    wherein the body contact is disposed beneath adjacent end portions of the body/channel regions of the plurality of semiconductor devices, and electrically connects the body/channel regions of the semiconductor devices together and to the substrate.

2. The semiconductor structure of claim 1, wherein the body contact is disposed under adjacent end portions of the gates of the semiconductor devices.

3. The semiconductor structure of claim 1, wherein the body contact is filled with a same conductive material as the body/channel regions of the semiconductor devices.

4. The semiconductor structure of claim 1, wherein a width of the body contact is larger than a width of each gate of the semiconductor devices.

5. A semiconductor structure comprising:
    an active semiconductor layer;
    an insulator layer having a first and second side, the first side being adjacent to the active semiconductor layer;
    a substrate disposed adjacent to the second side of the insulator layer;
    a plurality of semiconductor devices, each semiconductor device comprising source and drain regions and a body/channel region disposed within the active semiconductor layer, and sharing a common gate disposed on top of the active semiconductor layer; and
    a body contact disposed under the body/channel regions and in the insulator layer, and electrically connecting with and contacting with the body/channel regions of the semiconductor devices, and the substrate;
    wherein the body contact is disposed beneath adjacent end portions of the body/channel regions of the semiconductor devices, and electrically connects the body/channel regions of the semiconductor devices together.

6. The semiconductor structure of claim 5, wherein the body contact is filled with a same conductive material as the body/channel regions of the semiconductor devices.

7. The semiconductor structure of claim 5, wherein a width of the body contact is larger than a width of the common gate shared between the semiconductor devices.

* * * * *